(12) United States Patent
Jaeckle

(10) Patent No.: US 8,581,447 B2
(45) Date of Patent: Nov. 12, 2013

(54) METHOD AND DEVICE FOR OPERATING A CIRCUIT ARRANGEMENT

(75) Inventor: Holger Jaeckle, Mönchweiler (DE)

(73) Assignee: Continental Automotive GmbH, Hannover (DE)

( * ) Notice: Subject to any disclaimer, the term of this patent is extended or adjusted under 35 U.S.C. 154(b) by 554 days.

(21) Appl. No.: 12/933,250

(22) PCT Filed: Mar. 16, 2009

(86) PCT No.: PCT/EP2009/053058
§ 371 (c)(1),
(2), (4) Date: Sep. 17, 2010

(87) PCT Pub. No.: WO2009/115483
PCT Pub. Date: Sep. 24, 2009

(65) Prior Publication Data
US 2011/0018362 A1  Jan. 27, 2011

(30) Foreign Application Priority Data
Mar. 18, 2008  (DE) .......................... 10 2008 014 677

(51) Int. Cl.
*H01H 31/10* (2006.01)
*H01H 33/59* (2006.01)
*H01H 47/00* (2006.01)
*H01H 85/46* (2006.01)
*H01H 19/14* (2006.01)

(52) U.S. Cl.
USPC ......................................................... 307/115

(58) Field of Classification Search
USPC ................................................ 307/115, 140
See application file for complete search history.

(56) References Cited

U.S. PATENT DOCUMENTS

| | | | |
|---|---|---|---|
| 6,160,361 A | 12/2000 | Giannopoulos | |
| 7,009,403 B2 | 3/2006 | Graf et al. | |
| 2003/0160578 A1 | 8/2003 | Matsumoto | |
| 2006/0197469 A1* | 9/2006 | Kim | 315/291 |

FOREIGN PATENT DOCUMENTS

| | | |
|---|---|---|
| DE | 198 12 920 A1 | 12/1999 |
| DE | 198 44 665 C1 | 3/2000 |
| DE | 102 58 766 A1 | 7/2004 |
| DE | 10 2004 045 435 A1 | 3/2006 |
| GB | 2 428 301 A | 1/2007 |
| JP | 7-281704 A | 10/1995 |
| JP | 2002-508542 A | 3/2002 |
| JP | 2003-158447 A | 5/2003 |
| WO | WO 00/07415 | 2/2000 |
| WO | WO 2007/007111 A2 | 1/2007 |

* cited by examiner

*Primary Examiner* — Carlos Amaya
(74) *Attorney, Agent, or Firm* — Cozen O'Connor

(57) ABSTRACT

A current measurement apparatus includes first and second switches connected in parallel and operating in different current ranges, coupled to a processor which measures current and a controller which activates one or the other switch depending on the measured current.

10 Claims, 8 Drawing Sheets

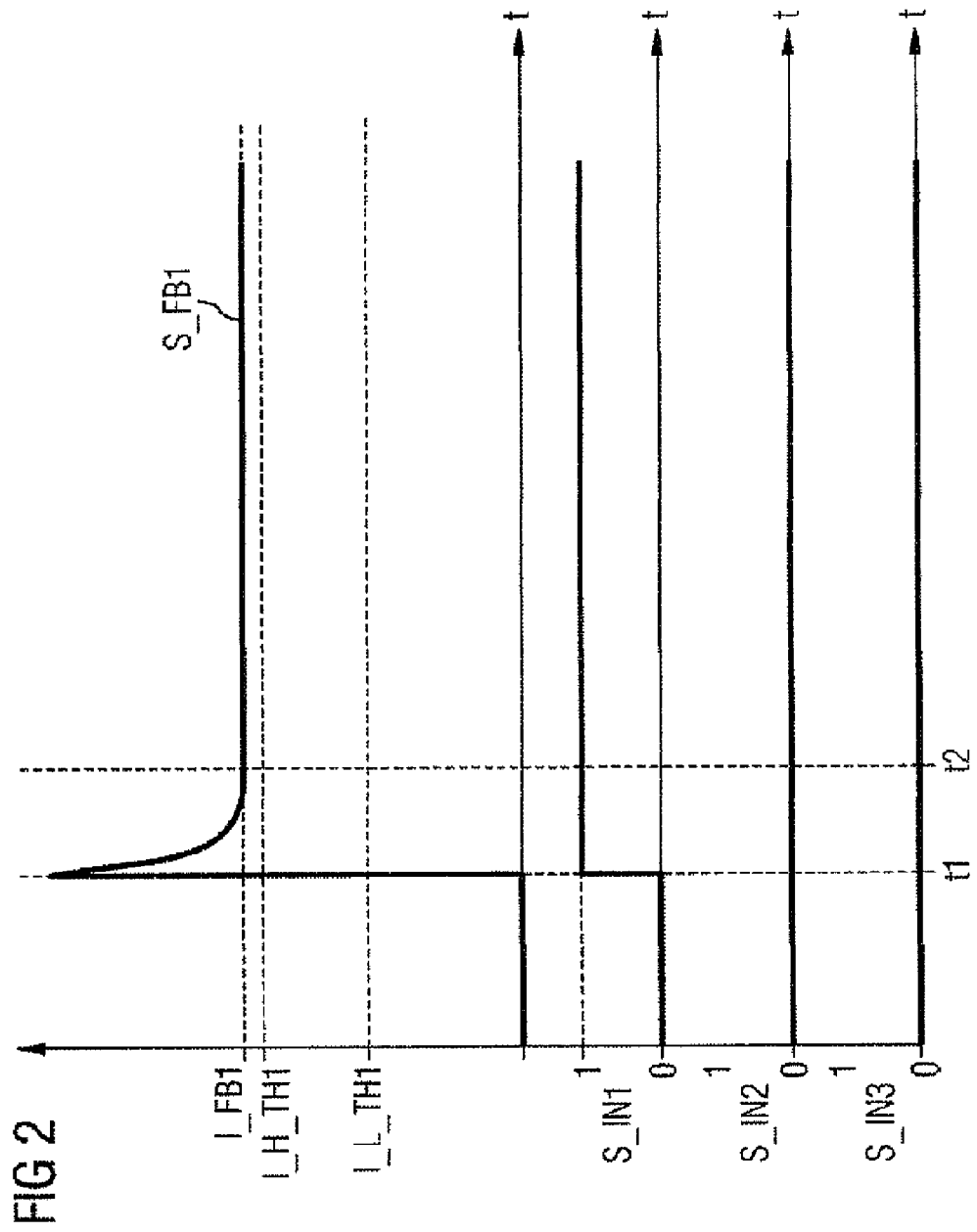

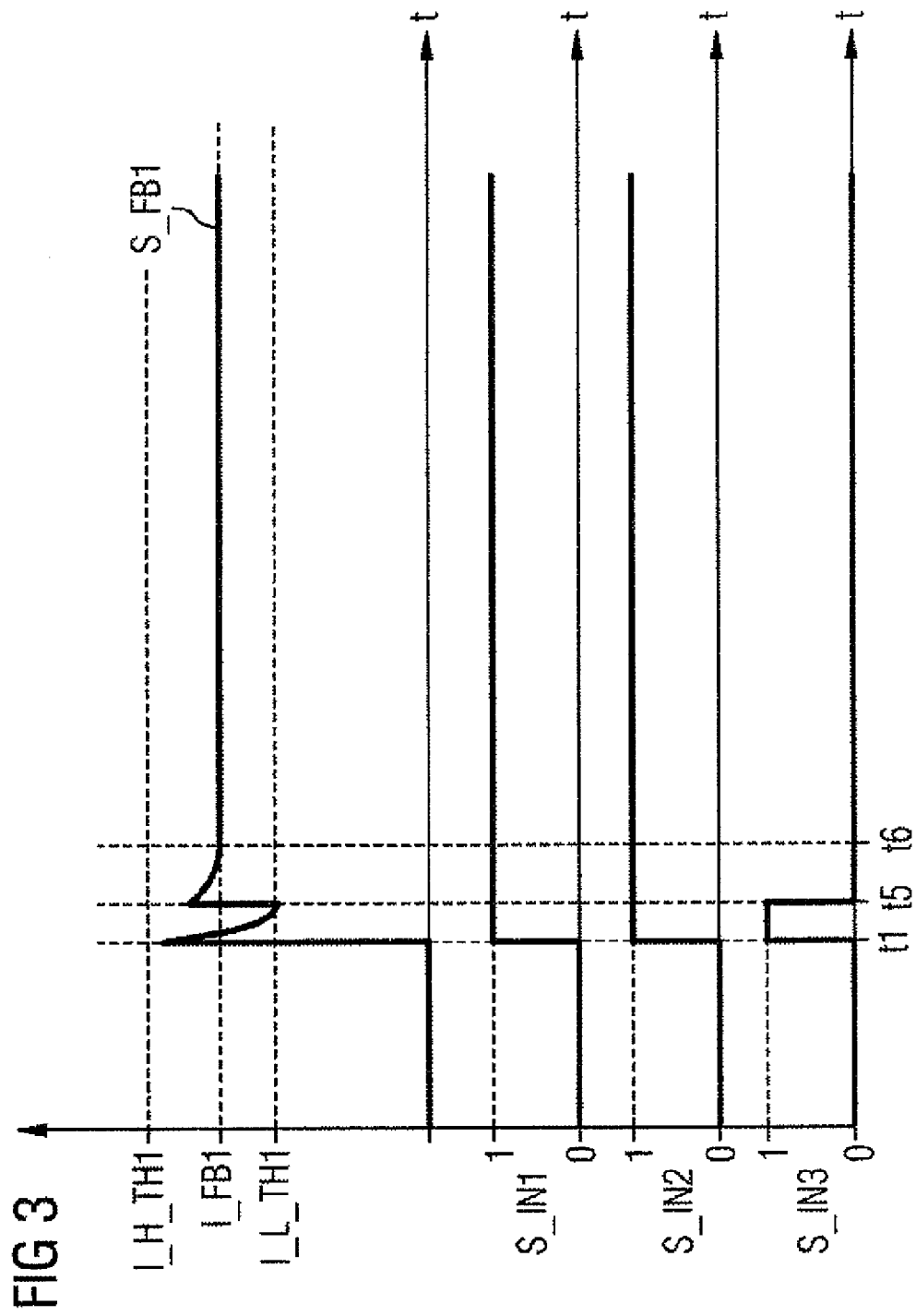

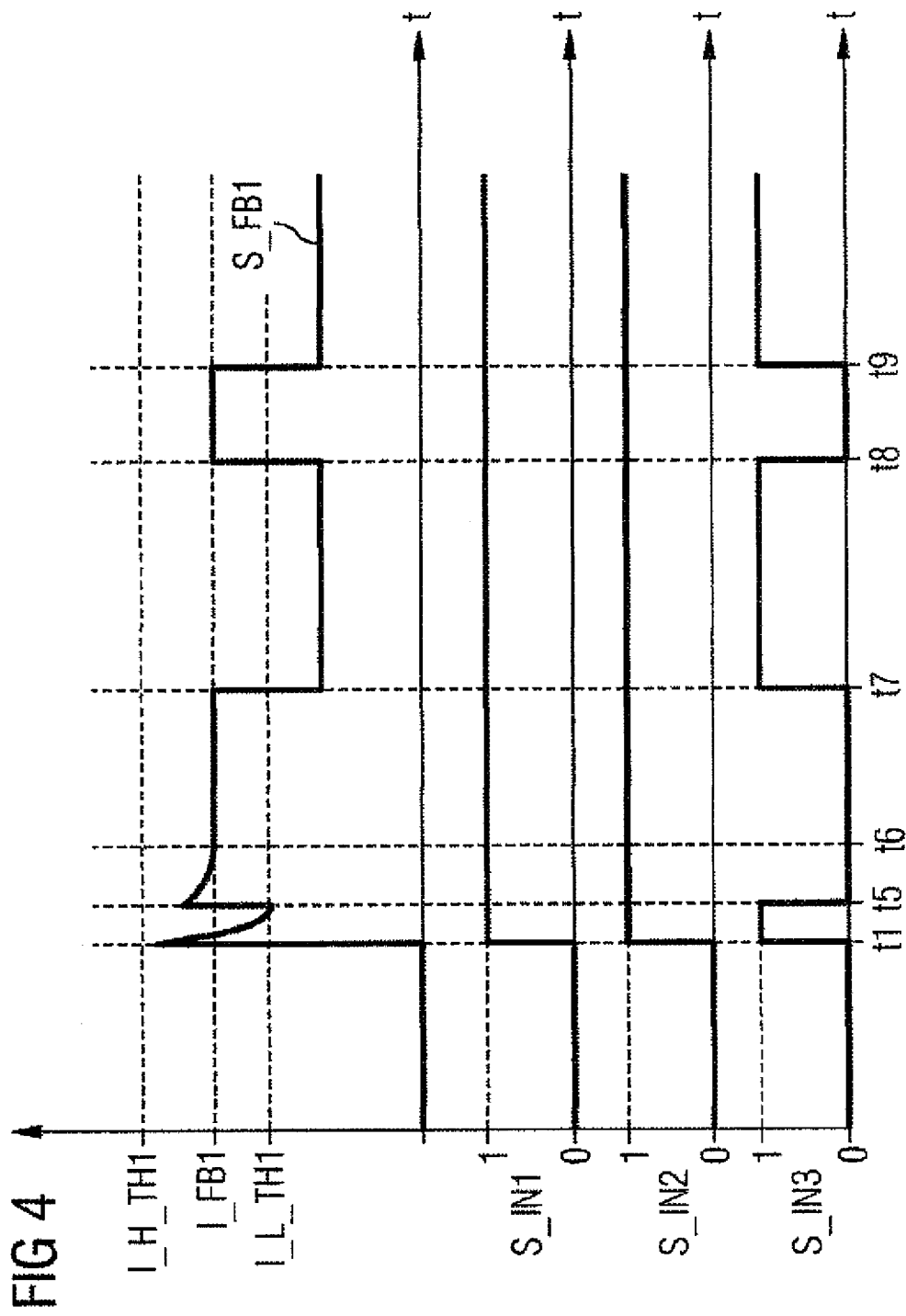

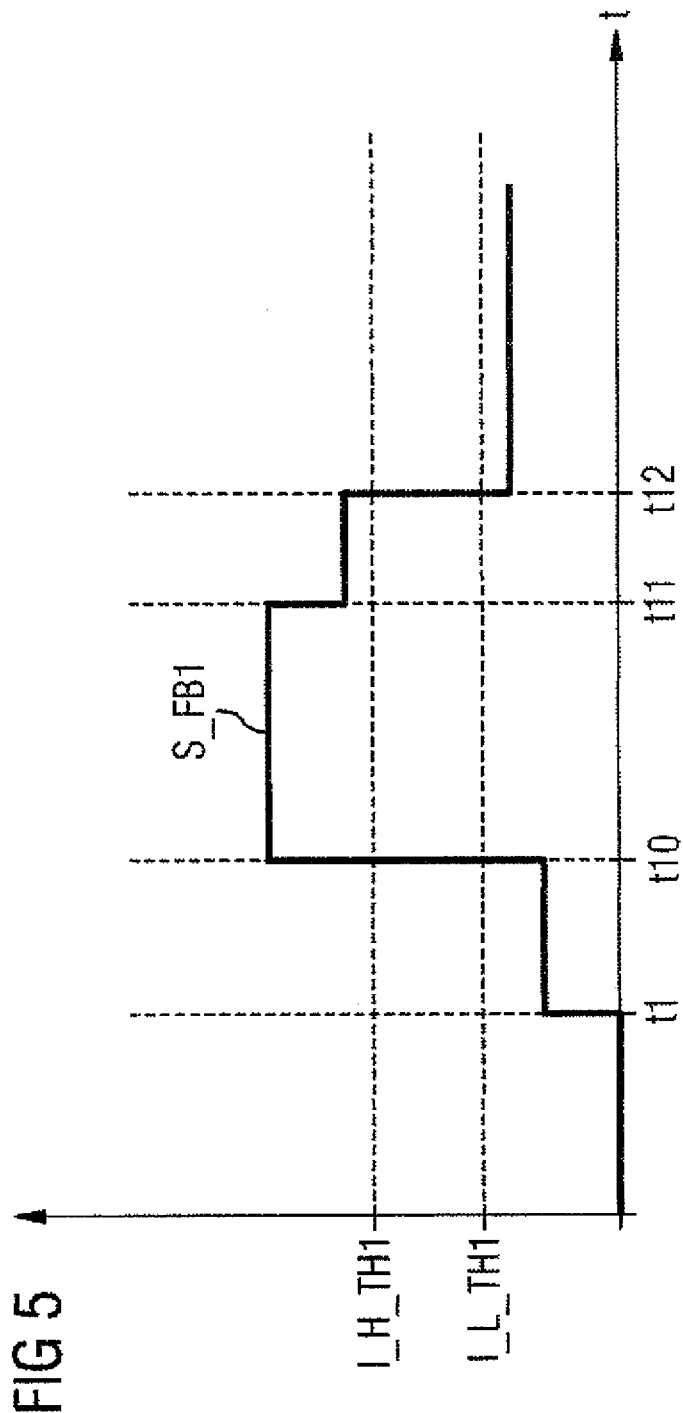

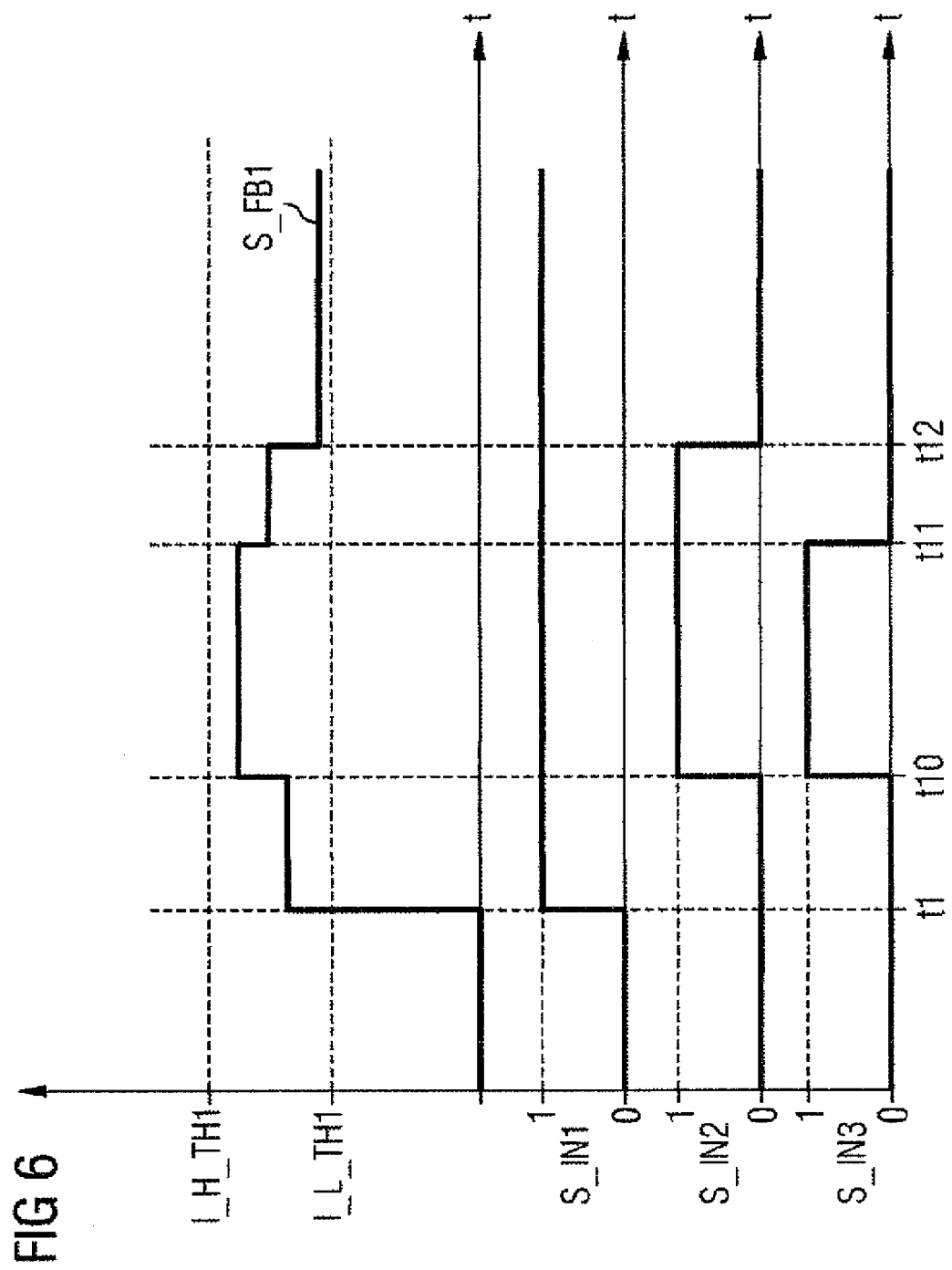

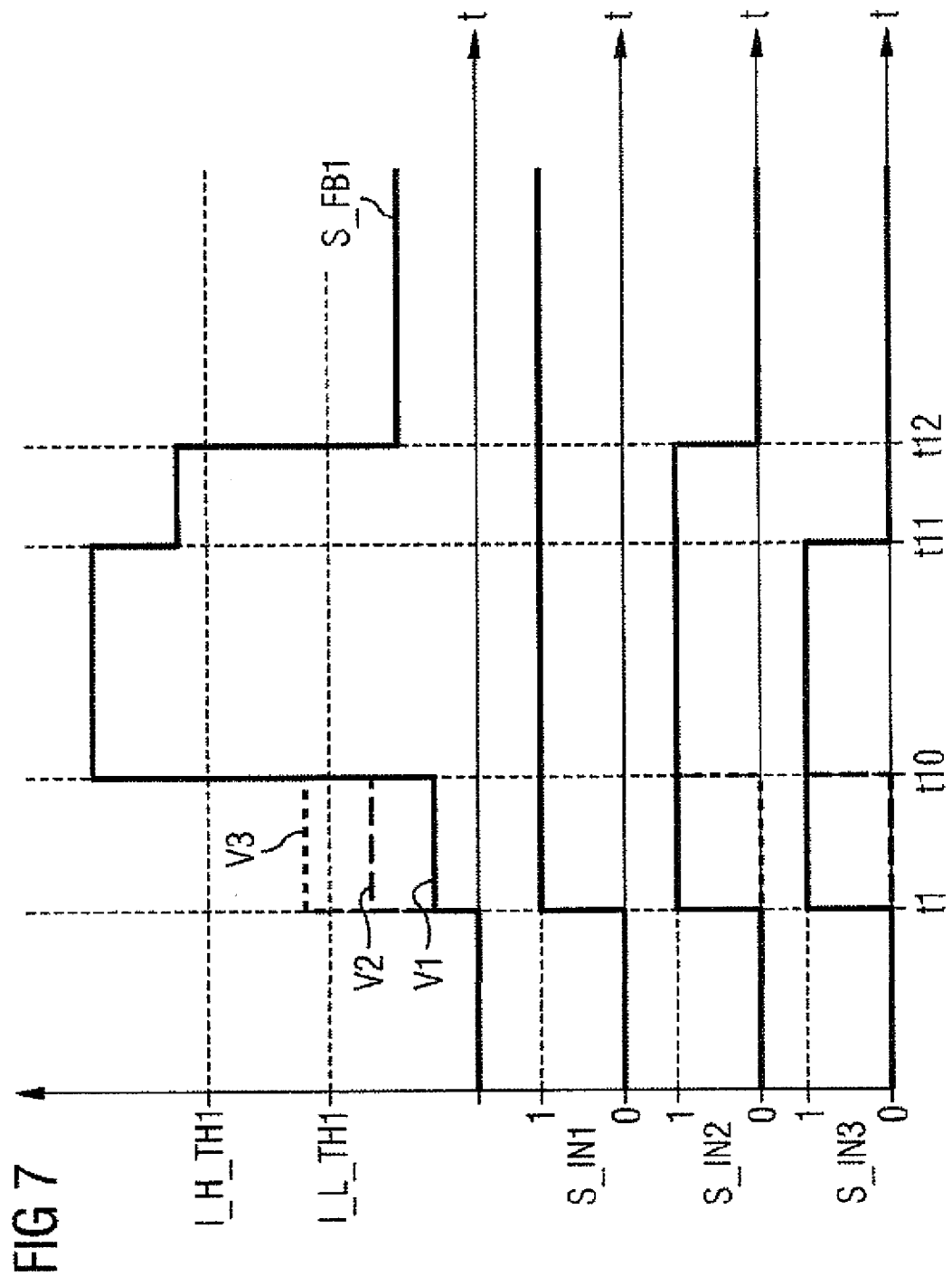

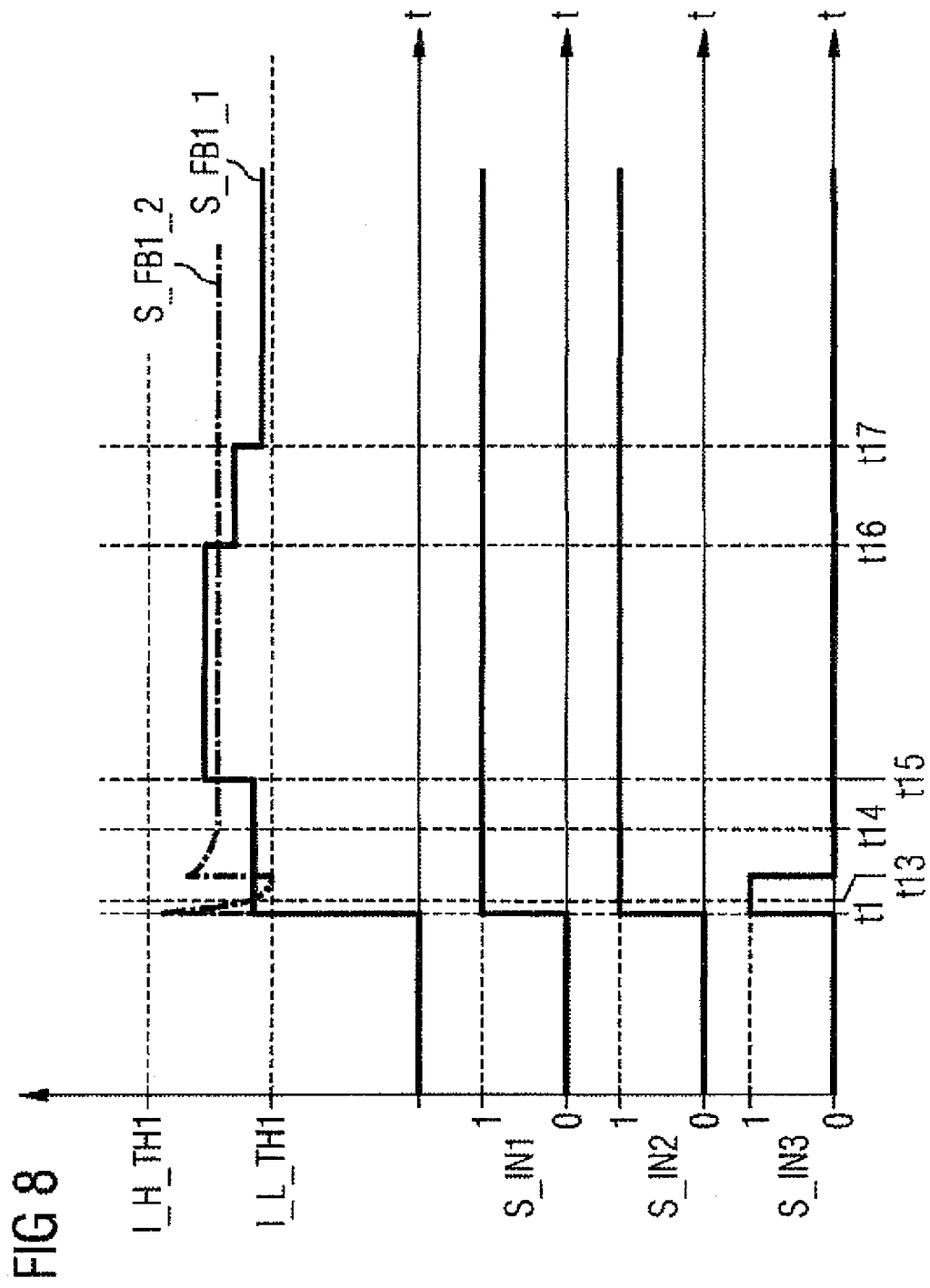

METHOD AND DEVICE FOR OPERATING A CIRCUIT ARRANGEMENT

PRIORITY CLAIM

This is a U.S. national stage of Application No. PCT/EP2009/053058, filed on Mar. 16, 2009, which claims priority to German Application No: 10 2008 014 677.3, filed: Mar. 18, 2008 the contents of which are incorporated herein by reference.

BACKGROUND OF THE INVENTION

1. Field of the Invention

The invention relates to a method and a device for operating a circuit arrangement having a plurality of switching elements assigned on the output side to at least one predefined common load, each being designed to make available, as a function of a switched position, a user signal at an output of the switching element of the at least one common load.

2. Related Art

Such switching elements are, for example, smart switching elements. Smart switching elements are short-circuit-protected switching elements having at least one switch and a monitoring unit assigned to the at least one switch, said switching elements switching off the switch by thermal monitoring when an overload current is conducted. These smart switching elements comprise at least one sensing output. A sensor signal, which is embodied, for example, as a sensor current, can be operated by the sensing output. The sensor signal is essentially representative of a current through the switch assigned to it. The sensor signal is preferably smaller than the load current through the switch represented by it by a predefined factor, for example 1000.

An object on which the invention is based is to specify a method and a device for operating a circuit arrangement which are certain and reliable.

SUMMARY OF THE INVENTION

One embodiment of the invention is defined by a method and a corresponding device for operating a circuit arrangement having a plurality of switching elements which are assigned on the output side to at least one predefined common load. The switching elements are each designed to make available, as a function of a switched position, a user signal at an output of the respective switching element of the at least one common load. In one or more determination steps, at least one selection of switched-on switching elements for actuating the at least one common load is changed until a sensor signal which is assigned to the respective switching element and is representative of the user signal of the respective switching element is in a value range predefined for it. In this context, that at least one selection of switched-on switching elements in which the respective sensor signal is in the value range predefined for it is determined and saved.

Using the respective determination of the selection of switched-on switching elements it is possible to predefine the respective sensor signal in a particularly reliable way for the value range which is predefined for it. This permits the respective sensor signal to be determined in a particularly reliable way. Values of the respective sensor signal and of the respective user signal can therefore be determined particularly accurately.

One or more determination steps may be necessary to determine the respective selection of switched-on switching elements. If the profile of the user signal has, for example, not yet reached a steady-state predefined value, for example during switching on of the respective switching element, it is also possible for more than one selection of switched-on switching elements to be determined and saved. In this context, the respective selection is preferably assigned to a predefined time segment and ensures therein that the respective sensor signal is in the value range predefined for it.

The at least one selection of switched-on switching elements can preferably be determined for a predefined time period. The predefined time period preferably comprises that profile of the respective user signal which has not yet reached the steady-state predefined value. This time period may, for example, be predefined or determined by virtue of the fact that the at least one selection of switched-on switching elements takes place only until the values of the user signal no longer change.

The predefined value range can, for example, be predefined as a measuring range, with the result that a sensor signal which represents the user signal can be determined particularly accurately and reliably if the values thereof are in the predefined value range. It is therefore possible to determine a faulty common load particularly reliably and therefore prevent damage to the circuit arrangement with particular certainty.

According to one advantageous refinement, that at least one selection of switched-on switching elements which is assigned to a predefined time segment with respect to a starting time of the actuation of the switching elements is determined and saved.

After the switching on of the predefined common load, changes in signal profile are typically assigned to the sensor signal and therefore to the user signal. In this context, one or more selection possibilities can be determined at switched-on switching elements in such a way that the respective sensor signal is in the value range assigned thereto. Each selection possibility of switched-on switching elements is preferably assigned to a predefined time segment with respect to the starting time. Within the respective time segment, the sensor signal is in the value range predefined for it. Such actuation of the common load therefore ensures particularly certain and reliable, as well as accurate, determination of the sensor signal and therefore of the user signal which is represented by it.

According to a further advantageous refinement, the at least one selection of switched-on switching elements is determined such that during a first determination step at first all the switching elements are switched on and the respective sensor signal is compared with the value range assigned to it, and if the predefined value range is undershot in absolute terms in at least one further determination step, a respective subset of the switching elements is switched off until the respective sensor signal is in the value range predefined for it.

This has the advantage that at least one selection possibility of switched-on switching elements can be determined particularly easily and reliably.

According to a further advantageous refinement, the at least one selection of switched-on switching elements is predefined in such a way that during a first determination step at first one switching element is switched on and the respective sensor signal is compared with the value range assigned to it, and if the predefined value range is exceeded in absolute terms in at least one further determination step, a respective subset of the switching elements is switched on until the respective sensor signal is in the value range predefined for it.

This has the advantage that at least one selection possibility of switched-on switching elements can be determined particularly easily and reliably.

According to a further advantageous refinement, a profile of the sensor signal which is assigned to the respective selection of switched-on switching elements and is representative of the at least one predefined common load is determined and saved.

In addition to the at least one selection of switched-on switching elements, that profile of the sensor signal which represents the common load can be determined and saved. The saved profile of the sensor signal which represents the at least one common load is, for example, assigned to a time segment with respect to the starting time of the actuation. During operation of the common load, the latter can be particularly easily and reliably detected by the determination of the profile of the sensor signal. After the detection of the at least one predefined common load, the switching elements can be actuated in accordance with the at least one selection of switched-on switching elements, which selection is assigned to the saved profile of the sensor signal by which the predefined common load is represented.

According to a further advantageous refinement, a currently determined profile of the sensor signal is compared with the at least one saved profile of the sensor signal, wherein the at least one saved profile of the sensor signal is representative of the at least one predefined common load. The at least one predefined common load is detected as a function of the comparison.

Using the comparison of the currently determined profile of the sensor signal with the at least one saved profile of the sensor signal, the at least one predefined common load can be detected particularly easily and reliably. After the detection of the at least one common load, the at least one selection of switched-on switching elements can be assigned to the latter and is in turn assigned to the saved profile of the sensor signal. As a result, reliable and certain operation of the at least one common load can be ensured. In addition, a faulty, common load can be detected quickly with certainty and damage to the circuit arrangement can be reliably avoided.

Furthermore, the invention is defined by a method and a corresponding device for operating a circuit arrangement having a plurality of switching elements which are assigned on the output side to at least one predefined common load and are each designed to make available, as a function of a switched position, a user signal at an output of the respective switching element of the at least one common load. During actuation of the at least one predefined common load, all the switching elements are switched on for a predefined first time period. The switching elements are actuated for a predefined second time period by at least one predefined selection of switched-on switching elements which is assigned to the predefined common load in which the respective sensor signal is in a value range predefined for it.

The actuation of the switching elements which is assigned to the first time period permits particularly low-loss operation of the common load. During this actuation, the sensor signal which represents the respective user signal is not in the value range predefined for it. On the other hand, the actuation of the switching elements which is assigned to the second time period permits particularly certain and reliable operation of the at least one common load. During this actuation, the sensor signal which represents the respective user signal is in the value range predefined for it, so that a faulty common load can be detected with particular certainty and particularly reliably and damage to the circuit arrangement can be particularly reliably avoided.

According to one advantageous refinement, the respective predefined common load is detected during the actuation during which all the switching elements are switched on. During the second time period, the switching elements are actuated by that predefined selection of switched-on switching elements which is assigned to the at least one predefined common load.

This has the advantage that particularly certain and reliable operation of the at least one common load can be ensured by the predefined selection of switched-on switching elements which is assigned to the at least one predefined load.

The at least one predefined common load can preferably be actuated periodically in an alternating fashion so that particularly low-loss and at the same time certain operation of the at least one common load is ensured. This has the advantage that a faulty common load is reliably determined and at the same time low-loss operation of the circuit arrangement is ensured.

BRIEF DESCRIPTION OF DRAWINGS

Exemplary embodiments of the invention will be explained in more detail below with reference to the schematic drawings, in which:

FIG. 2 is a first chronological illustration of a sensor signal in the case of a first predefined common load;

FIG. 3 is a second chronological illustration of a sensor signal in the case of a first predefined common load;

FIG. 4 is a third chronological illustration of a sensor signal in the case of a first predefined common load;

FIG. 5 is a first chronological illustration of a sensor signal in the case of a second predefined common load;

FIG. 6 is a second chronological illustration of a sensor signal in the case of a second predefined common load;

FIG. 7 is a third chronological illustration of a sensor signal in the case of a second predefined common load; and FIG. 8 shows a fourth chronological illustration of a sensor signal in the case of a second predefined common load.

DETAILED DESCRIPTION OF THE DRAWINGS

Figure 1:
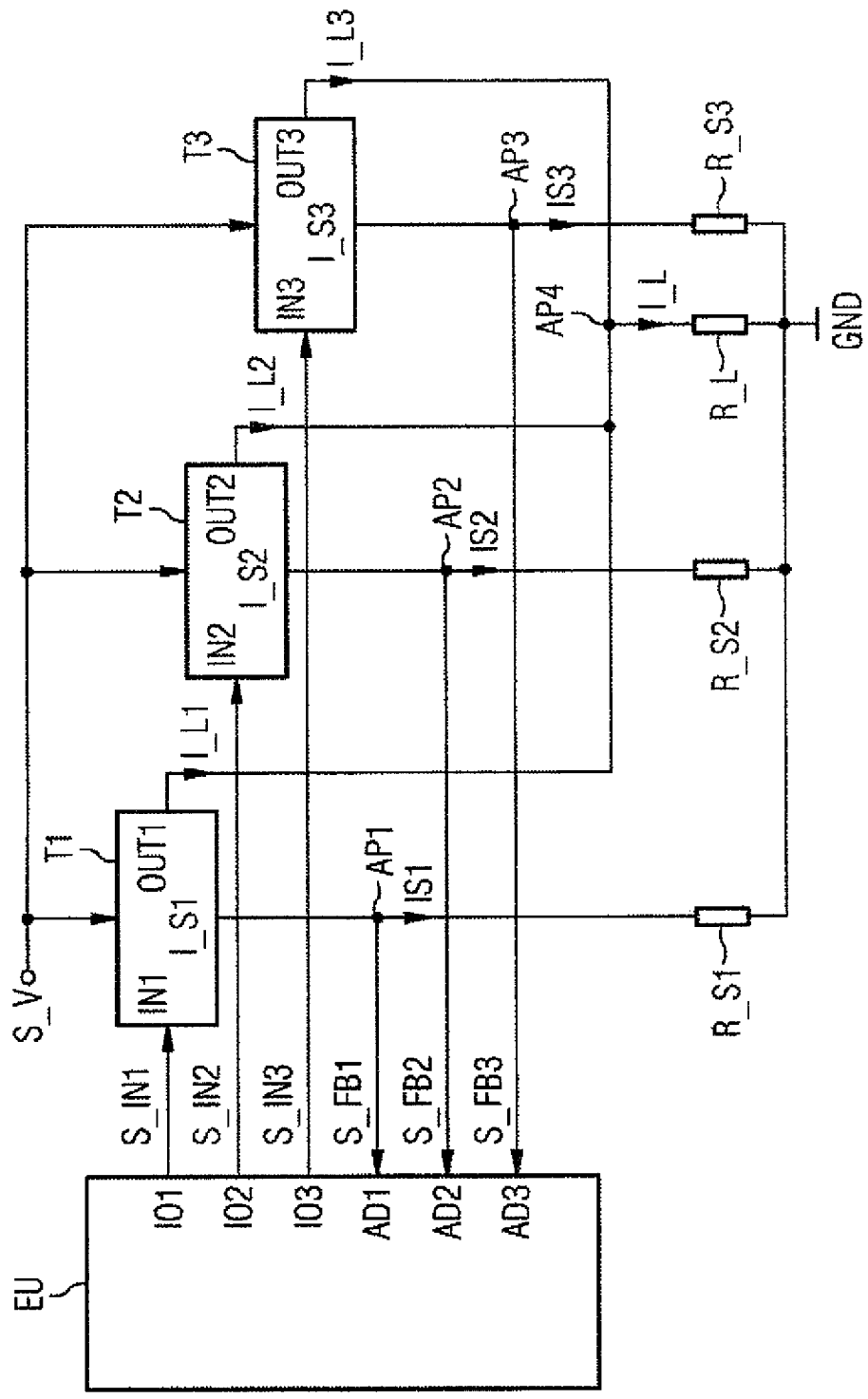
FIG. 1 is a schematic diagram of a circuit arrangement having a plurality of switching elements.

Elements with the same design or function are characterized by the same reference symbols in all the figures.

FIG. 1 illustrates a circuit arrangement having a first switching element T1, a second switching element T2 and a third switching element T3. The first, second and third switching elements T1, T2 and T3 are embodied, for example, as smart switching elements and each comprise a monitoring unit and a switch. The monitoring unit is embodied in each case, for example, as a thermal monitoring element. The switching elements T1, T2 and T3 are assigned to an input signal S_V, which is embodied, for example, as a supply voltage of an on-board power system of a motor vehicle. The switch which is assigned to the respective switching element is embodied in each case, for example, as a field-effect transistor and is preferably arranged between the connection of the input signal S_V and a load output which is assigned to the respective switching element. However, other embodiments of the switching elements which are known to a person skilled in the art are basically also conceivable.

The switching elements can, for example, be embodied separately or integrated in a common switching unit.

In addition, FIG. 1 illustrates a processing unit EU. The processing unit EU is designed to process a method for operating the circuit arrangement. The processing unit EU comprises a first input/output output IO1, a second input/output output IO2 and a third input/output output IO3. The first input/output output IO1 is assigned a first control signal S_IN1 on the output side. The second input/output output IO2 is assigned a second control signal S_IN2 on the output side, and a third control signal S_IN3 is assigned to the third input/output output IO3 on the output side. The first control signal S_IN1 is assigned to the first switching input IN1 of the first switching element T1 on the input side. The second control signal S_IN2 is assigned to the second switching input IN2 of the second switching element T2 on the input side. The third control signal S_IN3 is assigned to the third switching input IN3 of the third switching element T3 on the input side. The first, second and third input/output output IO1, IO2 and IO3 of the processing unit EU each have, when they are configured as an output, for example either a high level or a low level, for example 3.3 V for a high level or 0 V for a low level, which can be predefined independently of one another by the processing unit EU. Using the first control signal S_IN1, the processing unit EU can switch the first switching element T1 on and off as desired if there is not an overload. using the second control signal S_IN2, the processing unit EU can switch the second switching element T2 on and off as desired if there is not an overload. Using the third control signal S_IN3, the processing unit EU can switch the third switching element T3 on and off as desired if there is not an overload. The first, second and third switching elements T1, T2 and T3 can therefore be actuated independently of one another by the processing unit EU.

A first sensor signal S_FB1 is also assigned to the processing unit EU on the input side at a first analog/digital converter input AD1. The first sensor signal S_FB1 is tapped at a first tapping point AP1, which is assigned to a first sensing output I_S1 of the first switching element T1 and to the end, facing first switching element T1, of a first shunt resistor R_S1. The first sensor signal S_FB1 is representative of a first load current I_L1 which is embodied as a user signal. In a way which is analogous to the first sensor signal S_FB1, a second sensor signal S_FB2 is tapped at a second tapping point AP2. A third sensor signal S_FB3 is tapped at a third tapping point AP3. The second tapping point AP2 is assigned to a second sensing output I_S2 of the second switching element T2 and to the end, facing second switching element T2, of a second shunt resistor R_S2. The third tapping point AP3 is assigned to a third sensing output I_S3 of the third switching element T3 and to the end, facing third switching element T3, of a third shunt resistor R_S3. The second sensor signal S_FB2 and the third sensor signal S_FB3 are respectively assigned to a second analog/digital converter input AD2 and a third analog/digital converter input AD3 of the processing unit EU. The second sensor signal S_FB2 and the third sensor signal S_FB3 are therefore representative of a second load current I_L2 or a third load current I_L3 which are embodied as user signals.

The first, second and third analog/digital converter inputs AD1, AD2 and AD3 are preferably assigned to an analog/digital converter of the processing unit EU. Values of analog signals such as, for example, the first, second and third sensor signals S_FB1, S_FB2 and S_FB3 can be converted into digital values by the analog/digital converter of the processing unit EU, so that said values can be further processed by the processing unit EU, which is embodied, for example, as a microcontroller and therefore as a digital processing unit. However, the first, second and third analog/digital converter inputs AD1, AD2 and AD3 can basically also be assigned to different analog/digital converters of the processing unit EU.

In addition to the three analog/digital converter inputs, it is basically also possible to feed the first, second and third sensor signals S_FB1, S_FB2 and S_FB3 to a common multiplexer on the input side. An analog/digital converter input of the processing unit EU is assigned to the multiplexer on the output side. In addition, two actuation signals, which can be actuated by the processing unit EU, are fed to the multiplexer on the input side. As a function of predefined actuation of the processing unit EU, the sensor signal which is assigned to the actuation is selected by the multiplexer and determined by an analog/digital conversion. This arrangement has the advantage that just one analog/digital converter input of the processing unit EU is required and a particularly large number of sensor signals can be fed to the one analog/digital converter input by the multiplexer.

A reference potential GND is assigned to an end, facing away from the first switching element T1, of the first shunt resistor R_S1. In addition, the reference potential GND is assigned to an end, facing away from the second switching element T2, of the second shunt resistor RS2. The reference potential GND is assigned to an end, facing away from the third switching element T3, of the third shunt resistor R_S3. The reference potential GND is embodied, for example, as a ground of the motor vehicle.

The processing unit can basically also comprise more than three input/output outputs and more than three analog/digital converter inputs and therefore actuate more than three switching elements. Preferred circuit arrangements comprise up to eight switching elements which are actuated independently of one another by the processing unit EU and are assigned to at least one predefined common load R_L. However, it is basically also possible to actuate more or fewer switching elements.

On the output side, the first, second and third switching elements T1, T2 and T3 are assigned to a first end of the at least one predefined common load R_L at a fourth tapping point AP4. In this context, the first switching element T1 is coupled to the first end of the common load R_L by a first load output OUT1, the second switching element T2 is coupled to the first end of the common load R_L by a second load output OUT2, and the third switching element T3 is coupled to the first end of the common load R_L by a third load output OUT3.

A second end of the common predefined load R_L is assigned to the reference potential GND.

When the switch of the respective switching element is switched on, an electrical connection between the connection of the input signal V_IN and the respective load output is preferably switched to low impedance. When the switch of the respective switching element is switched off, the electrical connection of the input signal V_IN to the respective load output is switched to high impedance.

The predefined common load R_L is embodied, for example, as a filament lamp of the motor vehicle. The filament lamp is embodied, for example, as a lighting element in a headlight of the motor vehicle or as a lighting element of a passenger compartment lighting system of the motor vehicle. The common load can basically also represent more than one load, that is to say for example a plurality of filament lamps, which are then preferably arranged electrically in parallel. During operation of the common load R_L, the latter is assigned a common load current I_L which is fed by the first and/or second and/or third switching elements T1 and/or T2 and/or T3. When the first switching element T1 is switched on, the at least one common load R_L is assigned the first load current I_L1 on the input side. When the second switching element T2 is switched on, the at least one common load R_L is assigned the second load current I_L2 on the input side. When the third switching element T3 is switched on, the at least one common load R_L is assigned the third load current I_L3 on the input side. At the fourth tapping point AP4, the first, second and third load currents I_L1, I_L2 and I_L3 are added to form the common load current I_L.

Different actuation combinations for operating the predefined common load R_L are possible by the switching elements T1, T2 and T3.

For example, a first actuation combination is assigned a switched-on switching element and two switched-off switching elements, that is to say for example a switched-on first switching element T1, a switched-off second switching element T2 and a switched-off third switching element T3. In this context, the common load current I_L is assigned essentially only the load current of the switched-on switching element, that is to say for example the first load current I_L1 of the first switching element T1. In the first actuation combination, the load current of the switched-on switching element is configured essentially identically to the common load current I_L. The values of the sensor signal, representing the load current, of the switched-on switching element are therefore made particularly high and are essentially identical to the values of the common load current I_L.

A second actuation combination is assigned, for example, two switched-on switching elements and one switched-off switching element, that is to say for example a switched-on first switching element T1 and a switched-on second switching element T2 and a switched-off third switching element T3. In this context, the common load current I_L is assigned the load current of the two switched-on switching elements, that is to say for example the first and second load currents I_L1 and I_L2. In this actuation combination, the values of the load current of the respectively switched-on switching element are preferably made lower than the values of the respective load current in the first actuation combination.

A third actuation combination is assigned, for example, three switched-on switching elements, that is to say for example a switched-on first switching element T1, a switched-on second switching element T2 and a switched-on third switching element T3. In this context, the common load current I_L is assigned the load current of all three switching elements. In the third actuation combination, the common load current I_L is therefore divided among the three load currents of the first, second and third switching elements T1, T2 and T3. Given an identical embodiment of the three switching elements T1, T2 and T3, the absolute values of the first, second and third load currents I_L1, I_L2 and I_L3 are preferably configured identically, but are lower than the respective load current of the respective switching element in the first and second actuation combinations.

In addition to the switched-on and switched-off switching elements which are illustrated here by way of example, it is basically also respectively possible to switch other switching elements on or off.

Using a corresponding selection of the actuation combination of the switching elements, it is possible to vary the magnitude of values of the sensor signal which represent the respective load current. By switching on additional switching elements the value of the respective sensor signal is reduced, and by switching off additional switching elements the value of the respective sensor signal is increased. If a respective value range is predefined for the values of the respective sensor signal, the values of the respective sensor signal can be influenced by changing the actuation combination in such a way that the values of said sensor signal are in the value range predefined for it. The respective actuation combination therefore represents a predefined selection of switched-on switching elements.

In this context it is to be noted that in the case of load current measurements of a predefined common load, a predefined measuring range with the highest possible measuring accuracy is predefined in order to be able to ensure optimum monitoring of the at least one predefined common load and therefore optimum protection against overloading. If, for example, only the first actuation combination is predefined, only a small load current flows through the respectively switched-on switching element in the case of small power loading of the respective switching element. For example a large load current flows through the respectively switched-on switching element in the case of large power loading. Respective monitoring of the respective load current is preferably carried out by determining the respective sensor signal which is representative of the respective load current. Therefore, if only the first actuation combination is predefined for the actuation of the predefined common load, the currents which are assigned to the small power loading and the currents which are assigned to the large power loading is preferably monitored for possible overloading by the one switched-on switching element. In order, therefore, to be able to cope with monitoring of the common load in the case of small and large power loading, just one measuring range with restricted measuring accuracy is essentially available, as a result of which accurate monitoring of the at least one common load R_L is essentially not ensured. By using a plurality of switching elements which, as illustrated in FIG. 1, can be actuated in parallel, a suitable measuring range can be made available for the respective predefined common load by changing the actuation combinations during the actuation of the at least one common load R_L. This is advantageous in particular if the common load can also be configured differently.

However, so that the suitable value range can be predefined for the respective switching element with suitable measuring accuracy, the respective common load must first be reliably detected.

FIG. 2 illustrates the first actuation combination of switching elements. It shows a time profile of the first, second and third control signals S_IN1, S_IN2 and S_IN3 and of the first sensor signal S_FB1. For example the first switching element T1 is illustrated as the switched-on switching element in FIG. 2, wherein basically another switching element can also be configured as the switched-on switching element of the first actuation combination. The time profile of the first sensor signal S_FB1 represents a profile of the first load current I_L1 through the first switching element T1. In accordance with the first actuation combination, only the first switching element T1 is switched on, while the second and third switching elements T2 and T3 are switched off. The profile of the first sensor signal S_FB1 therefore represents essentially the profile of the common load current I_L through the predefined common load R_L, which is embodied in FIG. 2, for example, as a filament lamp.

At a switch-on time t1, the first switching element T1 is switched on by the first control signal S_IN1. The profile of the first sensor signal S_FB1 represents, starting at the switch-on time t1, a profile of a switch-on current of the common load R_L which is embodied as a filament lamp. In the case of another common load R_L, the profile of the first sensor signal S_FB1 can have a correspondingly changed profile.

The profile of the first sensor signal S_FB1 approaches, for example, a first predefined sensor signal value I_FB1 and is in a steady state at this value starting from a time t2.

It is therefore to be noted that the first sensor signal value I_FB1 is referred to the first sensor signal S_FB1, and a value, represented by the first sensor signal value I_FB1, of the first load current I_L1 is larger by the predefined factor, that is to say for example by the factor 1000.

A value range, assigned to the respective sensor signal, of the switched-on sensor signal is predefined in each case by a lower limiting sensor signal limiting value and an upper limiting sensor signal value. For example, the value range which is assigned to the first switching element T1 is predefined by a first lower limiting sensor signal value I_L_TH1 and a first upper limiting sensor signal limiting value I_H_TH1. The lower and upper limiting sensor signal values represent a value range which also can be embodied as a measuring range with suitable measuring accuracy. For example, the value range which is assigned to the respective switching element represents essentially a sensor signal range of the switching element within which accurate and certain representation of the respective load current is ensured by the sensor signal.

As is illustrated by FIG. 2, the profile of the first sensor signal S_FB1 after the switch-on time t1 is in absolute terms above the first upper limiting sensor signal limiting value I_H_TH1 and therefore outside the value range assigned to the first sensor signal S_FB1. Outside the predefined value range, respective values of the profile of the first sensor signal S_FB1 can be determined by an analog/digital conversion but only with restricted measuring accuracy.

A first exemplary embodiment with corresponding variation of the switched-on switching elements is illustrated in FIG. 3 by a further chronological illustration of the profile of the first sensor signal S_FB1 and a profile of the first, second and third control signals S_IN1, S_IN2 and S_IN3. The time profile of the first sensor signal S_FB1 represents the profile of the first load current I_L1. The common load R_L is in turn embodied as a filament lamp of the motor vehicle.

At the switch-on time t1, the predefined common load R_L is firstly actuated by the third actuation combination, i.e. all three switching elements T1, T2 and T3 are firstly switched on. As a result, the values of the respective sensor signal are reduced in such a way that they are each in the predefined value range. As illustrated in FIG. 3, the profile of the first sensor signal S_FB1 after the switch-on time t1 is in the value range assigned to it. The profile of the second and third sensor signals S_FB2 and S_FB3 are essentially configured analogously to the profile of the first sensor signal S_FB1.

Since undershooting in absolute terms of the first lower limiting sensor signal limiting value I_L_TH1 is possible at a time t5, the third switching element T3 is switched off at the time t5 by the third control signal S_IN3. The values of the sensor signals of the switched-on switching elements T1 and T2 increase and undershooting of the first, lower limiting sensor signal limiting value I_L_TH1 is avoided.

At a time t6, the profile of the first sensor signal S_FB1 is at a steady state at the first predefined sensor signal value I_FB1. The first sensor signal value I_FB1 is assigned to the value range of the first sensor signal S_FB1 in FIG. 3, and constitutes a value of the first sensor signal S_FB1 which can be determined particularly accurately and reliably.

Starting from the time t6, the profile of the first sensor signal S_FB1 can be monitored by continuous and/or periodic analog/digital conversion.

Since the profile of the first sensor signal S_FB1 from the time t5 is in the value range predefined for it, it is not necessary to switch on a further switching element, that is to say for example the third switching element T3, for this actuation of the common load R_L.

In order to operate the filament lamp as a predefined common load R_L, according to FIG. 3 the third actuation combination of switching elements is therefore necessary in the time segment t1 to t5, and in the time segment starting from the time t5 the second actuation combination is necessary for the respective values of the sensor signal to be in the value range predefined for it.

FIG. 4 illustrates a further exemplary embodiment by a further chronological illustration of the profile of the first sensor signal S_FB1 and a profile of the first, second and third control signals S_IN1, S_IN2 and S_IN3.

In a way which is analogous to FIG. 3, in FIG. 4 the third switching element T3 is switched off at the time t5, and undershooting of the first lower limiting sensor signal limiting value I_L_TH1 in absolute terms is therefore avoided. The first and second switching elements T1 and T2 continue to be switched on in accordance with the second actuation combination.

In a way which is analogous to FIG. 3, in FIG. 4 at the time t6 the profile of the first sensor signal S_FB1 has reached the steady state at the first, predefined sensor signal value I_FB1.

At a time t7, the third actuation combination is predefined by the processing unit EU and therefore the third switching element T3 is switched on by the third control signal S_IN3. Starting from this time t7, the common load current I_L results from the first, second and third load currents I_L1, I_L2 and I_L3. The values of the first load current I_L1 are therefore reduced in absolute terms and the values of the first sensor signal S_FB1 are therefore also reduced. The third actuation combination has the advantage that respective internal resistances, for example drain-source resistances of the respective switches, of the switching elements T1, T2 and T3 are connected electrically in parallel, and therefore the value of the resulting resistance is lower than the smallest value of the three internal resistances of the switching elements T1, T2 or T3. This reduces the power loss of the circuit arrangement, which allows particularly efficient operation of the common load R_L to be ensured. The third actuation combination is, however, not suitable for accurately determining the respective value of the first sensor signal S_FB1 because the profile of the first sensor signal S_FB1 undershoots the first lower limiting sensor signal value I_L_TH1 in absolute terms, and therefore the first sensor signal S_FB1 can typically be determined with restricted measuring accuracy within this time segment.

At a time t8, the third switching element T3 is switched off again by the third control signal S_IN3 which is assigned to it, and the second actuation combination is therefore predefined again. At a time t9, the third actuation combination is predefined again, and the third switching element T3 is therefore switched on again.

Within the time segment between the times t8 and t9, the values of the first sensor signal S_FB1 increase again and are in the value range, predefined for it, between the first lower limiting sensor signal value I_L_TH1 and the first upper limiting sensor signal limiting value I_H_TH1. Within this time segment, the first sensor signal S_FB1 can be determined again with suitable measuring accuracy, and the predefined common load R_L can be monitored particularly accurately.

Chronologically alternating actuation in accordance with the second and third actuation combinations in FIG. 4 is particularly advantageous if determination of the current value of the respective sensor signal is necessary only for predefined times, and determination of the respective sensor signal is not necessary for the other time segments. The chronologically alternating actuation of the second and third actuation combinations particularly advantageously combines accurate determination of the respective sensor signal with suitable measuring accuracy and particularly low-power-loss actuation of the common load R_L. The alternating actuation can particularly advantageously be carried out periodically according to the second and third actuation combinations of the switching elements.

The predefined common load R_L which is embodied as a filament lamp has a profile of the common load current I_L which is represented in FIG. 2 by the profile of the first sensor signal S_FB1. If such a profile of a respective sensor signal is determined, a filament lamp can be assigned as a common load R_L to this profile of the respective sensor signal. Such a profile of the respective sensor signal therefore represents a filament lamp as a common load R_L. If a plurality of filament lamps are connected electrically in parallel, the respective profiles are added, but continue to be representative of the filament lamps as a common load R_L.

So that a common load R_L can be detected with particular certainty and particularly reliably, it is firstly necessary to determine and to save the profile, representing the common load R_L, of the respective sensor signal. It is particularly advantageous if the respective profile of the sensor signal is in the value range predefined for it, and the sensor signal can therefore be determined particularly accurately. As is illustrated in FIG. 3 or 4, after the switching on various actuation combinations of switched-on switching elements are necessary to assign the respective sensor signal to the value range predefined for it. In addition to the profile of the sensor signal, at least one selection of switched-on switching elements is preferably also determined and saved.

The determination and saving of the profile of the respective sensor signal and of the necessary actuation combinations of the switching elements can preferably be carried out by the processing unit EU.

FIG. 5 illustrates a time profile of the first actuation combination, wherein, for example, the first switching element T1 is switched on and the second and third switching elements T2 and T3 are switched off. The profile of the first sensor signal S_FB1 represents, in comparison to FIG. 3 or 4, a common load current I_L of the predefined common load R_L, which is now embodied, for example, as a xenon lighting elements. The profile of the first sensor signal S_FB1 is embodied essentially in a step shape.

At the switch-on time t1, the first sensor signal S_FB1 which represents the common load current I_L (illustrated in idealized form) increases. The profile of the first sensor signal S_FB1 corresponds, starting at the time t1, to a profile of a switch-on current of the common load R_L which is embodied as a xenon lighting elements.

At a time t10, the profile of the first sensor signal S_FB1 increases again. At a time t11 and a time t12, the profile of the first sensor signal S_FB1 decreases before reaching, starting from the time t12, a steady state at a predefined value which represents, for example, the rated current of the xenon lighting elements.

In addition to the profile of the first sensor signal S_FB1, FIG. 5 also illustrates the first lower limiting sensor signal value I_L_TH1 and the first upper limiting sensor signal limiting value I_H_TH1. The first lower limiting sensor signal value I_L_TH1 and the first upper limiting sensor signal limiting value I_H_TH1 represent the predefined value range of the first sensor signal S_FB1. The predefined value range is undershot or exceeded in absolute terms essentially by the profile of the first sensor signal S_FB1, so that it is typically possible to determine the first sensor signal S_FB1 with restricted measuring accuracy.

In order to permit accurate determination of the respective sensor signal, at least a selection of switched-on switching elements must also be determined for the common load R_L which is embodied as a xenon lighting elements so that the respective sensor signal lies in the value range predefined for it.

FIG. 6 illustrates a time profile of the first sensor signal S_FB1 and a profile of the first, second and third control signals S_IN1, S_IN2 and S_IN3.

At the switch-on time t1, the first actuation combination is firstly predefined, i.e. a switched-on switching element and two switched-off switching elements. At the switch-on time t1, for example the first switching element T1 is switched on by the first control signal S_IN1, and the second and third switching elements T2 and T3 remain switched off. The first sensor signal S_FB1 increases (illustrated in an idealized form) to a predefined value which is in the value range predefined for it, and therefore permits accurate and certain determination of the first sensor signal S_FB1 with a suitable measuring accuracy. At the time t10, the third actuation combination is predefined, i.e. the second and third switching elements T2 and T3 are additionally switched on by the second and third control signals S_IN2 and S_IN3. As a result, the common load current I_L is divided among the first, second and third load currents I_L1, I_L2 and I_L3. The values of the first sensor signal S_FB1 therefore decrease in the time segment and are in the predefined value range.

At the time t11, the second actuation combination is predefined, i.e. the third switching element T3 is switched off, for example, by the third control signal S_IN3, so that starting from this time t11, the first and second switching elements T1 and T2 continue to be switched on. As a result, the values of the first sensor signal S_FB1 continue to be in the predefined value range, so that accurate determination of the first sensor signal S_FB1 is also ensured.

At the time t12, the first actuation combination is predefined again, i.e. the second switching element T2 is switched off, for example, by the second control signal S_IN2, so that only the first switching element T1 is switched on. Starting from the time t12, the common load current I_L has reached a steady state and the first sensor signal S_FB1 represents, at the time t12, a first load current I_L1 which represents, for example, a rated current of the common load R_L.

In order to ensure accurate determination of the profile of the respective sensor signal and therefore of the load current assigned to it, the first actuation combination is necessary in the time segment between t1 and t10, the third actuation combination in the time segment between t10 and t11, the second actuation combination in the time segment between t11 and t12, and again the first actuation combination in the time segment after the time t12.

The profile of the first sensor signal S_FB1 in the time segment between the time t1 and the time t12 is in the predefined value range and continues to be representative of the common load R_L which is embodied as a xenon lighting elements.

The profile of the first sensor signal S_FB1 and the necessary actuation combinations of the switched-on switching elements are also determined and saved here by the processing unit EU.

A determination of the profile, representing the common load R_L, of the respective sensor signal, that is to say for example the profile of the first sensor signal S_FB1, will be explained by FIG. 7. In this context, one or more determination steps are carried out by the processing unit EU in order to determine and save the profile of the respective sensor signal and the actuation combination, assigned to this profile, of the switched-on switching elements.

In a first determination step, the third actuation combination is firstly predefined at the switch-on time t1, i.e. the first, second and third switching elements T1, T2 and T3 are switched on at the switch-on time t1. By the processing unit EU, a first value V1 of the first sensor signal S_FB1 is compared with the first lower limiting sensor signal value I_L_TH1 and in this context undershooting of the first lower limiting sensor signal value I_L_TH1 in absolute terms is determined. Since the values of the first sensor signal S_FB1 in this time segment do not lie in the value range predefined for it, the first determination step is preferably stopped here and all of the switching elements are switched off by the control signals. For optimization purposes, it is basically also possible to continue to carry out the first determination step for the following time segments. This is advantageous in particular if, within a subsequent predefined time segment such as, for example, between the times t10 and t11, the third actuation combination is necessary so that the values of the respective sensor signal are in the value range predefined for it.

In a second determination step, the second actuation combination is preferably predefined, that is to say for example the first and second switching elements T1 and T2 are switched on, at the switch-on time t1. The third switching element T3 firstly remains switched off (see dashed illustration of the third control signal S_IN3). This second actuation combination is assigned a second value V2 of the first sensor signal S_FB1 (see dashed illustration of the first sensor signal S_FB1). This value is also compared with the first lower limiting sensor signal value I_L_TH1. Undershooting in absolute terms of the first lower limiting sensor signal value I_L_TH1 is determined again. Since, by the second actuation combination, the values of the first sensor signal S_FB1 are not in the value range predefined for it either, the second determination step is also preferably stopped here and all the switching elements are switched off by the control signals.

It is also conceivable here, for optimization purposes, to predefine the second actuation combination further for subsequent time segments.

In a third determination step, the first actuation combination is now predefined, for example only the first switching element T1 is switched on and the second and third switching elements T2 and T3 are switched off (see dashed and dotted illustration of the second and third control signals S_IN2 and S_IN3). The first actuation combination is assigned a third value V3 of the first sensor signal S_FB1 (see dotted illustration of the first sensor signal S_FB1). The third value V3 is also compared with the first lower limiting sensor signal value I_L_TH1 by the processing unit EU. In addition, the third value V3 can also be compared with the first upper limiting sensor signal value I_H_TH1 in order to prevent the first upper limiting sensor signal value I_H_TH1 being possibly exceeded. By the first actuation combination, the third value V3 of the first sensor signal S_FB1 is in the value range predefined for it. This ensures determination of the sensor signal S_FB1 in the time segment between t1 and t10 with suitable measuring accuracy. The first actuation combination of the switching elements and the corresponding profile of the first sensor signal S_FB1 are therefore assigned to this time segment and saved in the processing unit EU.

Since the values of the first sensor signal S_FB1 are, by the first actuation combination, in the value range predefined for said sensor signal S_FB1, the third determination step can be carried out for the following time segment. In a way which is analogous to the first time segment between t1 and t10, it is possible firstly to predefine the third actuation combination of the switching elements in the time segment between t10 and t11 again by the processing unit EU. However, it is alternatively also possible to continue with the first actuation combination which is already present. If the values of the first sensor signal S_FB1 are not in the value range predefined for it, the second actuation combination is predefined, and if said values are not in the predefined value range either, the first actuation combination is lastly predefined.

If the values of the respective sensor signal are not in the value range predefined for it even after the application of all the possible actuation combinations, it can be assumed, for example, that a determination process with the existing number and design of switching elements is possible only with restricted measuring accuracy, and operation of the predefined common load R_L is therefore not ensured with certainty. Alternatively, further actuation of the predefined common load can also be interrupted in order to avoid possible damage.

It is therefore preferably possible for the determination of the profile of the respective sensor signal and the determination of the respective assigned actuation combinations to be carried out for the respective time segment in such a way that at first the third and then the second and finally the first actuation combination is carried out. Basically, the determination process can also be carried out in such a way that at first the first, then the second and lastly the third actuation combination is carried out. However, it is alternatively also possible to combine both determination strategies. However, other determination strategies for determining the required actuation combinations are basically also conceivable.

The possible number of actuation combinations increases correspondingly when there are more than three switching elements, or is reduced when there are fewer than three switching elements.

If more than three switching elements are actuated, the required actuation combinations can be determined in such a way that at first all the switching elements are switched on, and a switching element is switched off with each further determination step if the preceding actuation combination is not suitable. Alternatively, it is also possible for just one switching element to be switched on at the beginning and for a further switching element to be switched on with each further required determination step for the respective time segment.

The determination and saving (illustrated in FIG. 7) of the respective actuation combination and of the profile which results therefrom for the respective sensor signal can also be carried out analogously onto another profile of the respective sensor signal, that is to say for example onto the profile, representing the filament lamp, of the first sensor signal S_FB1, as illustrated in FIGS. 3 and 4.

If, for example, an unknown common load R_L is connected to the switching elements T1, T2 and T3, it is preferably possible to infer the common load R_L by a comparison with the saved profiles of the respective sensor signal.

The detection of the common load R_L will be explained in more detail with reference to FIG. 8 assuming that actuation combinations and a profile of a sensor signal for a filament lamp and actuation combinations and a further profile of a sensor signal for a xenon lighting elements are determined and saved by the processing unit EU.

FIG. 8 illustrates a first saved profile S_FB1_1 of the first sensor signal S_FB1 which is representative of a common load R_L which is embodied as a xenon lighting elements. In addition, FIG. 8 shows a second saved profile S_FB1_2 of the first sensor signal S_FB1 which is representative of a common load R_L which is embodied as a filament lamp. The first and second saved profiles S_FB1_1 and S_FB1_2 of the first sensor signal S_FB1 are preferably saved in the processing unit EU.

If an unknown common load (not illustrated in FIG. 8) is then connected to the switching elements, for example the third actuation combination is predefined, i.e. the first, second and third switching elements T1, T2 and T3 are switched on, at the switch-on time t1. At a time t13, for example the current value of the first sensor signal S_FB1 is determined by an analog/digital conversion. If the value which is determined for the first sensor signal S_FB1 is in the value range predefined for it, said value is compared with the saved values, assigned to the time t13 in the processing unit EU, of the saved profiles which are assigned to a third actuation combination. For example, the value which is determined for the first sensor signal S_FB1 is compared with a value, assigned to the time t13, of the first saved profile S_FB1_1 because only this profile is assigned the third actuation combination at the time t13. If the value which is determined for the first sensor signal S_FB1 is in absolute terms in the region of the value, assigned to the time t13, of the first saved profile S_FB1_1, it is preferably possible to assume that the common load R_L is embodied as a filament lamp.

If the value which is determined for the first sensor signal S_FB1 is, in contrast, not in the value range assigned thereto, it is possible to assume that the common load R_L is embodied as a xenon lighting element because only in the case of the latter is the value of the sensor signal not in the predefined value range during actuation according to the third actuation combination. Basically, other detection strategies of the common load which are known to a person skilled in the art are also conceivable.

During the further operation of the common load R_L which is detected as a filament lamp, the saved actuation combinations which are assigned to the filament lamp are carried out so that the profile of the first sensor signal S_FB1 is in the value range predefined for it and determination of the first sensor signal S_FB1 with suitable measuring accuracy is ensured.

In order to be able to ensure particularly certain determination of the common load R_L, one or more further determination processes of the first sensor signal S_FB1 can take place, that is to say for example at a further time t14. If, for example, the value which is determined corresponds to the saved value, assigned at this time, of the second saved profile S_FB1_2 of the first sensor signal S_FB1, the filament lamp can be assigned as a common load R_L with a particularly high level of certainty.

Basically, in order to detect the respective common load R_L it is also possible to adopt the procedure that at first the process is started at the switch-on time t1 with that actuation combination which is assigned to the last actuated common load R_L. If, for example, a xenon lighting element has been actuated as a common load R_L during the last actuation, the process starts at the switch-on time t1 with an actuation combination which is assigned to the switch-on time t1 and the xenon lighting elements.

Basically, it is also conceivable to determine the previously operated common loads R_L statistically and to select a predefined actuation combination as a function of a resulting probability that the current common load R_L is connected to the switching elements.

In addition to the use of one or more identical loads as a predefined common load R_L, that is to say for example a plurality of filament lamps or a plurality of xenon lighting elements, it is also conceivable to connect a combination of various loads as a common load R_L to the switching elements. It is therefore possible for the common load R_L to have, for example, at least one filament lamp and at least one xenon lighting elements.

In addition to the determination and saving of the at least one actuation combination and the resulting profile of the respective sensor signal, the at least one actuation combination and the profile of the respective sensor signal can be predefined and already saved in the processing unit. As a result, it is not necessary to determine the at least one actuation combination and the profile of the respective sensor signal in advance.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A method for operating a circuit arrangement comprising a plurality of switching elements that are each connected on an output side to at least one predefined common load and are each configured to provide, as a function of a switched position, a user signal at an output of the respective switched element, the method comprising:
   changing in one or more determination operations at least one selection of switched-on switching elements for actuating the at least one predefined common load until a sensor signal assigned to the respective switching element that is representative of the user signal of the respective switching element is in a predefined value range; and
   determining and saving the at least one selection of switched-on switching elements in which the respective sensor signal is in the predefined value range.

2. The method as claimed in claim 1, wherein the at least one selection of switched-on switching elements which is assigned to a predefined time segment with respect to a starting time of the actuation of the switching elements is determined and saved.

3. The method as claimed in claim 2, further comprising:
   switching on all of the plural switching elements during a first determination;
   determining the at least one selection of switched-on switching elements such that during the first determination step the respective sensor signal;
   comparing the respective sensor signal with the value range predefined for it,
   wherein if the predefined value range is undershot in absolute terms in at least one further determination step, a respective subset of the switching elements is switched off until the respective sensor signal is in the predefined value range.

4. The method as claimed in claim 1, wherein at least one selection of switched-on switching elements is predefined such that during a first determination step initially one of the plural switching elements is switched on and the respective sensor signal is compared with the value range predefined for it, and if the predefined value range is exceeded in absolute terms in at least one further determination step, a respective subset of the switching elements is switched on until the respective sensor signal is in the predefined value range.

5. The method as claimed in claim 1, wherein a profile of the respective sensor signal assigned to the respective selection of switched-on switching elements and is representative of the at least one predefined common load is determined and saved.

6. The method as claimed in claim 1, wherein a currently determined profile of the sensor signal is compared with a saved profile of the sensor signal, wherein the saved profile of the sensor signal is representative of the at least one predefined common load and the at least one predefined common load is detected as a function of the comparison.

7. A device for operating a circuit arrangement having a plurality of switching elements which are assigned on the output side to at least one predefined common load and are each designed to make available, as a function of a switched position, a user signal at an output of the respective switching element of the at least one common load, wherein the circuit arrangement is designed
to change at least one selection of switched-on switching elements for actuating the at least one common load in one or more determination steps until a sensor signal which is assigned to the respective switching element and is representative of the user signal of the respective switching element is in a value range predefined for it,
to determine and save that at least one selection of switched-on switching elements in which the respective sensor signal is in the value range predefined for it.

8. A method for operating a circuit arrangement comprising a plurality of switching elements each coupled at respective output sides to at least one predefined common load each configured to provide, as a function of a switched position, a user signal at an output of the respective switching element of the at least one common load, the method comprising:
actuating the at least one predefined common load for a predefined first time period; and
switching all the switching elements on, wherein the switching elements are actuated for a predefined second time period by switching off a respective subset of the switching elements until a respective sensor signal is in a predefined value range.

9. The method as claimed in claim 8, further comprising:
detecting the respective predefined common load during the actuation in which all the switching elements are switched on; and
actuating, by at least one predefined selection of switched-on switching elements during the second time period, the switching elements assigned to the at least one predefined common load.

10. A device for operating a circuit arrangement comprising a plurality of switching elements that are each connected on an output side to at least one predefined common load and are each configured to provide, as a function of a switched position, a user signal at an output of the respective switched element, the circuit comprising:
a plurality of outputs ports configured to provide a signal to switch on all the switching elements for a predefined first time period during actuation of the at least one predefined common load, and to actuate the switching elements for a predefined second time period by switching off a respective subset of the switching elements until a respective sensor signal is in a predefined value range; and
a plurality of input ports configured to receive the respective sensor signals.

* * * * *